United States Patent [19]

Schell

[11] 4,265,999
[45] May 5, 1981

[54] PROCESS FOR THE PREPARATION OF PLANOGRAPHIC PRINTING FORMS

[75] Inventor: Loni Schell, Hofheim-Wallau, Fed. Rep. of Germany

[73] Assignee: Hoechst Aktiengesellschaft, Fed. Rep. of Germany

[21] Appl. No.: 104,559

[22] Filed: Dec. 17, 1979

[30] Foreign Application Priority Data

Dec. 21, 1978 [DE] Fed. Rep. of Germany ....... 2855393

[51] Int. Cl.³ ............................................... G03C 1/58
[52] U.S. Cl. ................................... 430/189; 430/302; 430/309; 430/330; 430/331
[58] Field of Search ............... 430/160, 166, 302, 309, 430/330, 331, 189

[56] References Cited

U.S. PATENT DOCUMENTS

| | | | |
|---|---|---|---|
| 3,046,121 | 7/1962 | Schmidt | 96/33 |
| 3,046,124 | 7/1962 | Schmidt | 96/33 |
| 3,869,292 | 3/1975 | Peters | 430/302 |

FOREIGN PATENT DOCUMENTS 1154749 6/1969 United Kingdom .
1555233 11/1979 United Kingdom .

*Primary Examiner*—Jack P. Brammer
*Attorney, Agent, or Firm*—James E. Bryan

[57] ABSTRACT

A process for the preparation of planographic printing forms is described, in which a light-sensitive material composed of a support having a hydrophilic surface and of a light-sensitive layer, which contains a 1,2-naphthoquinone-diazide, is exposed imagewise, developed and then heated to a temperature above 180° C. for such a time and at such a temperature level that an oleophilic precipitate is formed on the hydrophilic image background, and the precipitate is then removed by treatment, for example wiping over, with an aqueous solution of about 0.01 to 50% by weight of polyvinyl phosphonic acid. The treatment has the advantage that in this case the support surface, for example anodically produced aluminum oxide, is not significantly attacked and is nevertheless completely freed from impurities.

5 Claims, No Drawings

PROCESS FOR THE PREPARATION OF PLANOGRAPHIC PRINTING FORMS

This invention relates to a process for the preparation of planographic printing forms having a high capacity with respect to the printing run and to the constancy of tonal values upon printing.

As is known from German Offenlegungsschrift No. 1,447,963, the printing run and the quality thereof can be increased by heating the imaged plate to elevated temperatures in the range of 180° C. to 240° C.

In this burning-in process, residues appear in the non-image areas. According to indications in German Offenlegungsschrift No. 1,447,963, the residues are removed by an after-treatment with an alkaline or acid solution, for example with hydrofluoric acid or trisodium phosphate.

A disadvantage of the treatment with hydrofluoric acid is the health hazard. Trisodium phosphate in the required concentration attacks the anodically produced oxide layer of aluminum supports, which are generally used in order to achieve long printing runs.

The method of after-treating burned-in offset plates, as described in German Pat. No. 854,890, for resin-free diazo layers, for example using 1% concentration phosphoric acid, does not give satisfactory results in the case of layer compositions, such as are used according to the present state of the art for the preparation of high-performance printing forms.

German Offenlegungsschrift No. 2,626,473, describes a process wherein an aqueous solution is applied before burning-in. The most effective agents of this type are solutions of sulfonic acid salts which have the character of wetting agents. In this case, however, there is a risk that the plate is not adequately rinsed after burning-in and wetting agents which thus adhere interfere with the course of printing. Inorganic salts, applied before burning-in, in many cases lead to the formation of stains on the printing stencil. The process is relatively time-consuming since the application is carried out in most cases with dry rubbing.

It is the object of the invention to provide a process in which the precipitate formed during the burning-in of planographic printing forms can be removed readily and effectively with a small effort while leaving the support surface largely unaffected.

The starting point of the invention is a process for the preparation of planographic printing forms, in which a light-sensitive material composed of a support having a hydrophilic surface and of a light-senstive layer, which contains a 1,2-naphthoquinone-diazide, is exposed imagewise, developed and then heated to a temperature above 180° C. for such a time and at such a temperature level that decomposition of the ink-carrying image parts takes place and an oleophilic precipitate is formed on the hydrophilic image background, and the precipitate is then removed by treatment with an aqueous solution.

The process according to the invention includes using an aqueous solution of 0.01 to 50% by weight of polyvinyl phosphonic acid for the removal of the precipitate.

According to a special embodiment of the process, a water-soluble polymer, for example gum arabic or polyvinyl alcohol, additionally can be added to the after-treatment solution and a preservation of the surface of the printing form thus can be carried out at the same time as the cleaning. The polymer is added in a quantity which is customary for preserving solutions, suitable in a quantity of about 2 to 40, preferably 5 to 20, percent by weight.

The polyvinyl phosphonic acid can have molecular weights within wide ranges. Those polyvinyl phosphonic acids, the 33% concentration aqueous solutions of which have viscosities of about 50 to 220 mPa·s at 20° C., have proved to be particularly effective.

Although the concentration of the polyvinyl phosphonic acid can lie in the entire range indicated above and can be even higher, more dilute solutions, for example in the range from 0.05 to 25% by weight, are in general preferred for cost reasons.

The solution is applied in the customary manner, for example by wiping over, rubbing, brushing or spraying. If prints are to be produced from the plate immediately afterwards, the treatment solution is rinsed off with water. If the plate is to be preserved at the same time, the solution is in general dried in the customary manner on the surface.

Suitable light-sensitive materials which advantageously can be processed by the process according to the invention are all positive-working materials with o-quinone-diazides, in particular naphthoquinone-(1,2)-diazides. The light-sensitive layers of the materials also contain, in a known manner, alkali-soluble resins, in particular phenolic resin novolaks, appropriately in a quantity of 1 to 10 parts by weight per part by weight of o-quinone-diazide. Suitable materials are described, for example, in German Offenlegungsschriften Nos. 1,447,963, 2,331,377, 2,547,905, and 2,718,259, and in German Pat. No. 938,233.

Suitable carrier materials are, in particular, aluminum foils which have been roughened mechanically, chemically or electrolytically. Aluminum foils which additionally carry an anodically produced oxide layer are preferred because, using these, particularly long printing runs can be achieved.

Apart from the after-treatment step polyvinyl phosphonic acid solution, the materials are processed in known manner, such as is described, for example, in German Offenlegungsschrift No. 1,447,963.

The examples which follow illustrate advantageous embodiments of the process. Percentage data and quantitative ratios are to be understood as units by weight, unless otherwise stated.

EXAMPLE 1

An electrochemically roughened and anodized aluminum foil (3 g of aluminum oxide/m$^2$) is coated with a solution of 2.17 g of the 4-($\alpha,\alpha$-dimethyl-benzyl)-phenyl ester of naphthoquinone-(1,2)-diazide-(2)-4-sulfonic acid, 1.02 g of the esterification product obtained from 1 mole of 2,2'-dihydroxy-dinaphthyl-(1,1')-methane and 2 moles of naphthoquinone-(1,2)-diazide-(2)-5-sulfonic acid chloride, 0.37 g of naphthoquinone-(1,2)-diazide-(2)-4-sulfonic acid chloride, 0.12 g of Crystal Violet base, and 9.90 g of a cresol/formaldehyde novolak (softening point 112°–118° C.), 55 cc of tetrahydrofuran, 45 cc of ethylene glycol monomethyl ether and 11 cc of butyl acetate, in such a way that, after drying, the resulting layer weight is 3.8 g/m$^2$.

The plate is exposed (Ozasol exposure unit Violight-/BA 578 5 kW—distance 1 m) under a positive original for 1.5 minutes, is developed with a 5% concentration sodium metasilicate nonahydrate solution, rinsed with water, wiped with a doctor blade, dried in air and heated for 10 minutes in an oven to 240° C. After cooling, the plate is lightly and uniformly wiped over with a 10% concentration aqueous solution of polyvinyl phosphonic acid, rinsed with water, and preserved.

In the printing machine, the preservative is wiped off with a moist sponge, and the plate then gives very long runs of scum-free prints.

If a 10% concentration solution of polyvinyl sulfonic acid is used for the treatment instead of polyvinyl phosphonic acid and the other working steps are kept the same, the plate scums in the printing machine.

If the procedure followed corresponds to the manner hitherto customary, i.e., if, after burning-in, the plate is treated to 2 minutes with a 5% concentration solution of trisodium phosphate dodecahydrate, the electrochemically roughened and anodized support has a weight loss of 2.35 g/m$^2$, i.e. the oxide layer of the support material is severely attacked, and an optimum water-carrying capacity and an optimum printing run are no longer ensured.

Using the treatment solution according to the invention, this defect does not arise.

EXAMPLE 2

An offset printing plate is prepared according to Example 1 and burning-in is carried out for 10 minutes at 230° C. This plate is treated with a solution of the following composition:

16 g of polyvinyl alcohol having a viscosity of 4 mPa·s in a 4% concentration aqueous solution at 20° C. and a residual acetyl content of 10.7%,
14 g of yellow potato dextrin, completely water-soluble, Ostwald viscosity=2.80, pH value 2.8, and
30 g of polyvinyl phosphonic acid in
240 g of water.

The solution is allowed to dry as a preservative on the surface of the plate.

Several days later, the plate is wiped off, if required, with a moist sponge in the printing machine, and fault-free prints are obtained. In this process, an additional working step, to free the plate from burning-in residues, is eliminated.

EXAMPLE 3

A mechanically roughened aluminum foil is coated with a solution of 1.5 g of the condensation product obtained from 1 mole of 2,3,4-trihydroxy-benzophenone and 1 mole of naphthoquinone-(1,2)-diazide-(2)-5-sulfonic acid chloride,
0.8 g of the condensation product obtained from 1 mole of 2,2'-dihydroxy-1,1'-dinaphthylmethane and 2 moles of 1,2-naphthoquinone-diazide-(2)-5-sulfonic acid chloride,
6 g of the novolak indicated in Example 1 and
120 cc of ethylene glycol monomethyl ether in such a way that the resulting layer weight is 1.15 g/m$^2$.

The plate is exposed for 1 minute, developed as in Example 1, burned-in for 10 ninutes at 240° C. and wiped over with an aqueous solution which contains 0.5% of polyvinyl phosphonic acid and 15% of gum arabic. The solution is dried on the plate and, after storage for about 1 to 2 days or longer, removed in the printing machine with a moist sponge.

Scum-free prints are obtained.

EXAMPLE 4

A light-sensitive printing plate, prepared as in Example 1, is exposed and developed in the same way as in that Example. It is then burned-in for 10 minutes at 240° C. and wiped over with a 40% concentration aqueous solution of polyvinyl phosphonic acid. The solution is then rinsed off with water, and the plate is wiped with a doctor blade and preserved using a solution of 10% of polyvinyl alcohol and 5% of dextrin.

Fault-free, a scum-free prints are obtained

If, however, the treatment is carried out with 1% concentration phosphoric acid, as described in Example 7 of German Pat. No. 854,890, the print is not free of scum.

EXAMPLE 5

A printing plate is prepared as in Example 1 and burned-in for 10 minutes at 240° C. After cooling, it is wiped over with 0.1% concentration polyvinyl phosphonic acid. The solution is then rinsed off, and the plate is wiped with a doctor blade and preserved with a dextrin solution or clamped directly into the printing machine.

Scum-free prints are obtained.

It will be obvious to those skilled in the art that many modifications may be made within the scope of the present invention without departing from the spirit thereof, and the invention includes all such modifications.

What is claimed is:

1. In the process for the preparation of planographic printing forms, in which a light-sensitive material composed of a support having a hydrophilic surface and of a light-sensitive layer, which contains a 1,2-naphthoquinone-diazide, is exposed imagewise, developed and then heated to a temperature above 180° C. for such a time and at such a temperature level that decomposition of the ink-carrying image parts takes place and an olephilic precipitate is formed on the hydrophilic image background, and the precipitate is then removed by treatment with an aqueous solution, the improvement which comprises using an aqueous solution of about 0.01 to 50% by weight of polyvinyl phosphonic acid for the removal of the precipitate.

2. A process as claimed in claim 1 wherein the solution used for the removal of the precipitate additionally contains a water-soluble polymer which is suitable for preserving the plate.

3. A process as claimed in claim 2 wherein said water-soluble polymer is present in a quantity of about 2 to 40% by weight.

4. A process as claimed in claim 1 wherein said aqueous solution comprises 0.05 to 25% by weight of polyvinyl phosphonic acid.

5. A process as claimed in claim 1 wherein the polyvinyl phosphonic acid has a viscosity of about 50 to 220 mPa·s at 20° C. in a 33 percent concentration aqueous solution.

* * * * *